United States Patent [19]

Tomita

[11] Patent Number: 5,193,005
[45] Date of Patent: Mar. 9, 1993

[54] CHANNEL SELECTING APPARATUS HAVING A CHANNEL SKIP FUNCTION

[75] Inventor: Shigeru Tomita, Gunma, Japan

[73] Assignee: Kabushiki Kaisha Toshiba, Kawasaki, Japan

[21] Appl. No.: 863,533

[22] Filed: Apr. 6, 1992

Related U.S. Application Data

[63] Continuation of Ser. No. 517,655, May 1, 1990, abandoned.

[30] Foreign Application Priority Data

May 1, 1989 [JP] Japan .................. 1-112894

[51] Int. Cl.⁵ .............................................. H04N 5/50
[52] U.S. Cl. ............................ 358/191.1; 358/193.1; 358/195.1
[58] Field of Search ............... 358/191.1, 193.1, 195.1, 358/197; 455/314, 315, 316, 192, 164, 166, 173, 182, 185

[56] References Cited

U.S. PATENT DOCUMENTS

| | | | |
|---|---|---|---|
| 4,249,259 | 2/1981 | Oda et al. | 455/182 |
| 4,737,993 | 4/1988 | DeVilBiss | 455/180 |
| 4,763,195 | 8/1988 | Tults | 358/193.1 |
| 4,776,038 | 10/1988 | Testin et al. | 455/182 |
| 4,821,122 | 4/1989 | Teskey | 358/181 |
| 4,823,387 | 4/1989 | Tults | 380/13 |
| 4,939,789 | 7/1990 | Sakashita et al. | 455/260 |
| 5,034,819 | 7/1991 | Tsukagoshi | 358/191.1 |

*Primary Examiner*—Michael T. Razavi
*Assistant Examiner*—Tuan V. Ho
*Attorney, Agent, or Firm*—Cushman, Darby & Cushman

[57] ABSTRACT

In a CATV receiver or television receiver channel selecting apparatus provided with a controlling device wherein, on the basis of a channel-up or channel-down channel selecting operation, data corresponding to local oscillation frequencies of the respective channels are output, a tuning voltage is prepared by using these data and the local oscillation frequency of the tuner is controlled, the above mentioned controlling device is provided with a device for memorizing the information as to whether it is inhibited or permitted to select the respective channels at the time of the channel-up or channel-down channel selection so as to memorize the common channel selection inhibiting information for a plurality of channels not allowed to exist simultaneously and to be ablve to save the memory capacity of the memory (RAM) of the channel selecting microcomputer; and further, a device for quickly searching the input signal frequency of the channel without a misoperation in the case of selecting an objective channel at the time of the up/down channel selection is provided.

16 Claims, 11 Drawing Sheets

|  | RECEIVING CHANNEL | SKIP FLAG | MEMORY CAPACITY |
|---|---|---|---|
| POSITION NO.1 | CATV 1CH | ☐ | TOTAL 1 BIT |
| POSITION NO.2 | CATV 2CH, VHF 2CH | ☐ | TOTAL 1 BIT |
| POSITION NO.13 | CATV 13CH, VHF 13CH | ☐ | TOTAL 1 BIT |
| POSITION NO.14 | CATV 14CH | ☐ | TOTAL 1 BIT |
| POSITION NO.64 | CATV 64CH | ☐ | TOTAL 1 BIT |
| POSITION NO.65 | CATV 65CH, UHF 14CH | ☐ | TOTAL 1 BIT |
| POSITION NO.94 | CATV 94CH, UHF 43CH | ☐ | TOTAL 1 BIT |
| POSITION NO.95 | CATV 95CH | ☐ | TOTAL 1 BIT |
| POSITION NO.99 | CATV 99CH | ☐ | TOTAL 1 BIT |
| POSITION NO.100 | CATV 100CH, UHF 44CH | ☐ | TOTAL 1 BIT |
| POSITION NO.125 | CATV 125CH, UHF 69CH | ☐ | TOTAL 1 BIT |

GROSS TOTAL 125 BITS

FIG. 3

$$\begin{cases} fo_2 : \text{VALUE OF fosc* CORRESPONDING} \\ \quad\quad\text{TO VIDEO CARRIER P} \\ \quad\quad\text{OF DESIRED CHANNEL} \\ \Delta fosc^* = fosc^* - fo_2 \end{cases}$$

|  | RECEIVING CHANNEL | SKIP FLAG | MEMORY CAPACITY |
|---|---|---|---|
| POSITION NO.1 | CATV 1CH | ☐ | TOTAL 1 BIT |
| POSITION NO.2 | CATV 2CH | ☐ | TOTAL 1 BIT |
| ⋮ | ⋮ | ⋮ | ⋮ |
| POSITION NO.125 | CATV 125CH | ☐ | TOTAL 1 BIT |
| POSITION NO.126 | UHF 14CH | ☐ | TOTAL 1 BIT |
| ⋮ | ⋮ | ⋮ | ⋮ |
| POSITION NO.181 | UHF 69CH | ☐ | TOTAL 1 BIT GROSS TOTAL 181 BITS |

FIG. 20 (RELATED ART)

CHANNEL SELECTING APPARATUS HAVING A CHANNEL SKIP FUNCTION

This is a continuation of application Ser. No. 07/517,655, filed on May 1, 1990, which was abandoned upon the filing hereof.

BACKGROUND OF THE INVENTION

1. Field of the Invention

This invention relates to a channel selecting apparatus to be used for CATV receivers and television receivers.

2. Description of the Related Art

Generally, the CATV is multi-channeled to diversify the television service. For example, in the United States of America, a multi-channel CATV system realizing the transmission exceeding 100 channels is operated and a channel selecting system including a tuner so that the receiver may also correspond to it is designed.

As a channel selecting operation system wherein the receiving channel is designated in a CATV receiver or television receiver, there is a system wherein the channel number is continuously sequentially switched. That is to say, the channel number is sequentially made to rise up to a larger number from a smaller number or to fall down reversely to a smaller number from a larger number to select a desired channel. This is called an up-/down channel selecting system.

In this up/down channel selecting system, in order to elevate the operatability, the system is generally set to move to the next channel by skipping over a channel not broadcasting at the time of selecting the channel or a channel in which no receiving is desired. That is to say, it is preset to skip the channel. In a presetting method, the number of the channel desired to be selected is memorized in the address position corresponding to this channel number of a memory (RAM), a region in which the information as to whether this channel is skipped or not is written, that is, a skip flag is set and the skip information of each channel is memorized in the skip flag.

In a receiver wherein the same tuner is used so that both of a CATV and TV may be received, as shown in FIG. 20, for example, a total of 181 CH of 1 to 125 CH (CH is an abbreviation of the channel here and also hereinafter) of the CATV and 14 to 69 CH of the UHF of the TV are made to correspond to position numbers 1 to 181 and are provided respectively with skip flags. This example is based on the actual channels readily available in the United States of America, and 2 to 13 CH of the VHF of the TV and 2 to 13 CH of the CATV are of substantially the same frequency and the same positions.

As shown in FIG. 20, one bit is required for each of the skip flags corresponding to 181 CH and a memory capacity of 181 bits is required in order to realize the preset. Generally such channel selecting system is formed of a microcomputer but, there has been a problem that, as the capacity of the memory (RAM) is limited, if the above mentioned memory capacity (of 181 bits) is to be secured, it will have to be selected whether the function of the microcomputer is reduced or the memory is externally fitted. That is to say, there has been a problem that the memory (RAM) capacity of the conventional microcomputer is so small that the number of the skip flags can not be taken to be so large.

SUMMARY OF THE INVENTION

The present invention is developed to eliminate the above mentioned problems and an object of the present invention is to provide channel selecting apparatus wherein the number of skip flags can be made small and the memory (RAM) capacity of the microcomputer can be effectively utilized.

The present invention is a channel selecting apparatus comprising a tuner whereby a high frequency signal is mixed with a local oscillation signal controlled by a tuning voltage so as to be converted to an intermediate frequency signal to receive a signal of a desired channel and a controlling means whereby data corresponding to a local oscillation frequency are output in each channel on the basis of a channel-up or channel-down channel selecting operation, a tuning voltage is prepared by using these data and the local oscillation frequency of the above mentioned tuner is controlled, wherein the information as to whether the selection of each channel is to be inhibited or permitted at the time of the channel-up or channel-down channel selection is memorized in the above mentioned controlling means and a common channel selection inhibiting information memorizing means is provided for a plurality of channels not allowed to exist simultaneously.

BRIEF DESCRIPTION OF THE DRAWINGS

FIG. 3 is an explanatory view for explaining a skip flag and its memory capacity used in the channel selecting apparatus according to the present invention.

FIG. 20 is an explanatory view for explaining a conventional presetting method using skip flags and the memory capacities of the memories then.

DETAILED DESCRIPTION OF THE PREFERRED EMBODIMENTS

Before explaining an embodiment of the channel selecing apparatus according to the present invention in FIGS. 1 and 2, the differences from the conventional example in FIG. 20 shall be explained with reference to FIG. 3.

FIG. 3 is an explanatory view for explaining a skip flag set in the channel selecting apparatus according to the present invention and its memory capacity.

In the embodiment shown in FIG. 3, the skip flags are made common, because, for example, in the United States of America (which shall be mentioned merely as US hereinafter), CATV 2 to 13CH and VHF 2 to 13CH of TV are of the same frequency on the same channel number. Also, on CATV 65 to 94CH, UHF 14 to 43CH of TV and CATV 100 to 125, UHF 44 to 69CH of TV in US, as in, for example, CATV 125CH (of a video carrier frequency of 799.25 MHz) and UHF 69CH (of a video carrier frequency of 801.25 MHz), the respective channel center frequencies are separated from each other only by 2 MHz, the signals will be mixed if broadcast simultaneously (that is to say, in the M-NTSC system adopted in US, the sole frequency band one channel is of 6 MHz, whereas the frequency distance between the above mentioned two channels is only 2 MHz) and therefore the skip flags are made common. If the skip flags are thus made common between 1 to 125CH of CATV and CH of VHF and UHF of TV, a memory capacity for 56 bits will be able to be saved as compared with the conventional example in FIG. 20.

In this embodiment, in case the receiving channels are set as fixed to 1 to 1 in response to the position numbers and it is judged by using skip flags whether a skip is made or not, in setting the position numbers and receiving channels as fixed to correspond to each other in the step of producing the receiver, CATV 2 to 13CH and VHF 2 to 13CH of TV will be made to correspond to the position numbers 2 to 13 and CATV 65 to 94CH, 100 to 125CH and UHF 14 to 69CH of TV will be made to correspond to the position numbers 65 to 94 and 100 to 125. Therefore, the position numbers may be 1 to 125 corresponding to which skip flags of 125 bits may be provided.

In another later described embodiment channel selecting apparatus provided with an AFT (automatic fine tuning) detector, the above described difference of a frequency of 2 MHz can be absorbed and the channel selecting data can be made common in these positions.

From the above, the skip flags can be made common in VHF 2 to 13CH and UHF 14 to 69CH of TV and in CATV 2 to 13 and CATV 65 to 94 and 100 to 125CH.

Figure 1:
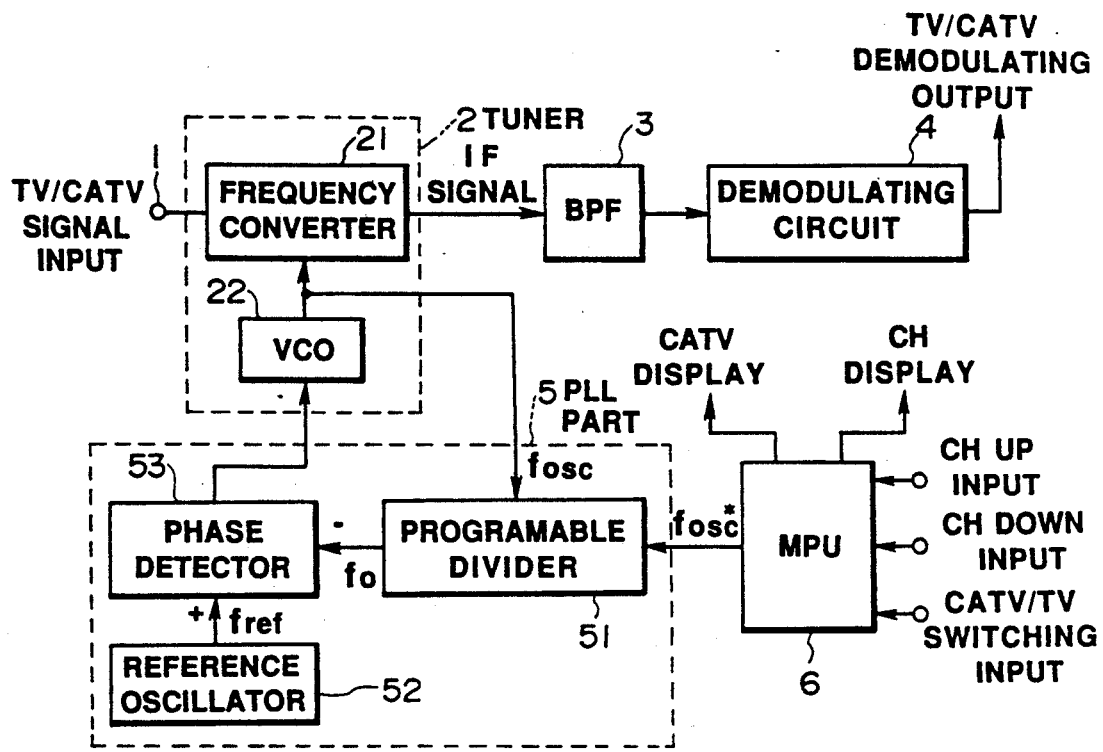
FIG. 1 is a block diagram showing an embodiment of the channel selecting apparatus according the present invention.

FIG. 1 is a block diagram showing an embodiment of the channel selecting apparatus according to the present invention. The embodiment in FIG. 1 shows a channel selecting apparatus of a frequency synthesizer system. In the receiver in which this channel selecting apparatus is used, both CATV and TV signals can be received by using the same tuner.

In FIG. 1, a TV or CATV high frequency signal (which shall be mentioned as an RF signal hereinafter) is input from an antenna or the like not illustrated. This RF signal is fed to a tuner 2 comprising a frequency converter 21 and a voltage controlled oscillator (which shall be mentioned as a VCO hereinafter) 22. The frequency converter 21 converts the input RF signal to an intermediate frequency signal (which shall be mentioned as an IF signal hereinafter) by local oscillation frequency from the VCO 22 which generates a local oscillation frequency fOSC corresponding to a tuning voltage fed from a PLL part 5. The above mentioned IF signal is fed to a demodulating circuit 4 through a band pass filter (which shall be mentioned as a BPF hereinafter) 3. A TV or CATV demodulating output is obtained from the demodulating circuit 4. On the other hand, a central operation processing apparatus (which shall be mentioned as an MPU hereinafter) 6 generates data fOSC* (digital data delivered by the MPU 6 and represented by a local oscillation frequency expression) corresponding to the local oscillatiion frequency for each channel on the basis of the up or down input of the channel (that is, the position) and the CATV/TV switching input from a key input means not illustrated and feeds them to the PLL part 5. The MPU 6 will judge whether a skip is to be made or not for each channel with reference to an internal skip flag memory (See FIG. 2) at the up and down time of the channel. Also, the MPU 6 has a function of displaying the channel number of the CATV at the up and down time of the channel. The above mentioned PLL part 5 comprises a programable divider 51, a reference oscillator 52 and a phase detector 53. The programable divider 51 is a variable frequency divider dividing the local oscillation frequency fOSC from the VCO 22 by the control signal fOSC* from the MPU 6. The reference oscillator 52 is formed of a crystal oscillator and generates a reference oscillation frequency f ref. The phase detector 53 compares the phases of the reference oscillation output f ref and the frequency dividing output fo of the programable divider 51 and operates so that, when the phase of fo advances more than f ref, the output will lower. This output is a voltage output and is fed to the VCO 22 which is so formed that, when the input voltage increases, the oscillation frequency will increase. Therefore, as a result, the loop of the VCO 22, programable divider 51, reference oscillator 52 and phase detector 53 will become a PLL (phase synchronizing loop). By this PLL action, fOSC operates to be equal to fOSC*. Therefore, if fOSC* is delivered from the MPU 6, the local oscillation frequency fOSC of the VCO 22 will be able to be set at any desired value.

Figure 2:
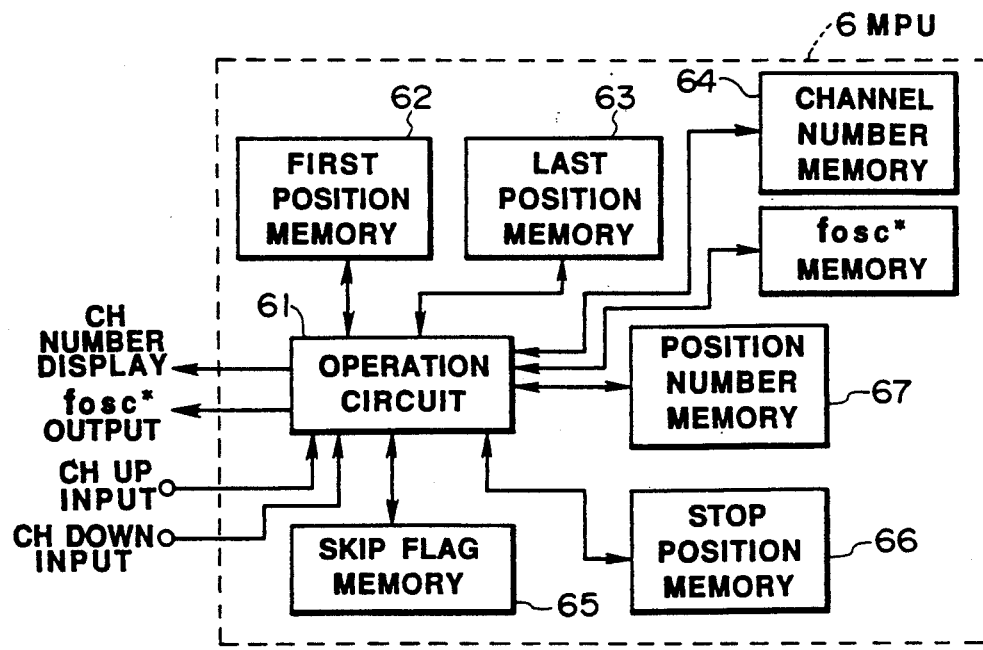
FIG. 2 is a block diagram showing the formation of an MPU in FIG. 1.

FIG. 2 is an internal block diagram of the MPU in FIG. 1. This diagram is explained on the case that the CATV/TV switching input is a CATV input.

As shown in FIG. 2, the channel up or channel down input is fed to an operation circuit 61 to which are connected a first position memory 62 memorizing 1 position (that is, 1CH) which is the first position of the CATV at the CATV receiving time and a last position memory 63 memorizing 125 position (that is, 125CH) which is the last position of the CATV. These memories 62 and 63 define respectively the upper limit and lower limit of the number of channels at the up/down channel selecting time.

Also, to the operation circuit 61 are connected a channel number memory 64 memorizing channel number data corresponding to the position numbers 1 to 125 of the CATV, a skip flag memory 65 memorizing the information as to whether a skip is to be made or not at the up/down channel selecting time on the respective channels of the CATV and a stop position memory 66 to be used to judge (in the step S4 in FIG. 5) whether the operation is to be pulled out of the skip flag reference loop (closed loop of the steps S2 to S5 in FIG. 5) or not when the information to be skipped is memorized in the skip flag memory 65 corresponding to all the positions. In the stop position memory 66, the position number, for example, up by 1 from the present position number (in the step S1 in FIG. 5) is to be memorized at the up/down channel selection starting time point. When the stop position is thus provided, even in case the skip flag 1 stands in all the positions, the reference loop of the above mentioned skip flag will end by one round (that is, in the stop position) and the operation will be able to be pulled out of the reference loop of skip flags.

Further, to the operation circuit 61 are connected a position number memory 67 memorizing position numbers and an fOSC* memory memorizing data of fOSC* corresponding to the channel numbers.

In the above mentioned circuit, in the operation circuit 61, when a channel-up or channel-down input is received, a channel to be selected without skipping will be judged with reference to the skip flag memory 65, the judged selected channel will be memorized in the position number memory 67, data corresponding to this channel will be read out of the channel number memory 64, data fOSC* corresponding to the local oscillation frequency corresponding to the channel number will be prepared with reference to the fOSC* memory and will be output to the PLL part 5 and the channel number display data will be output.

Figure 4:
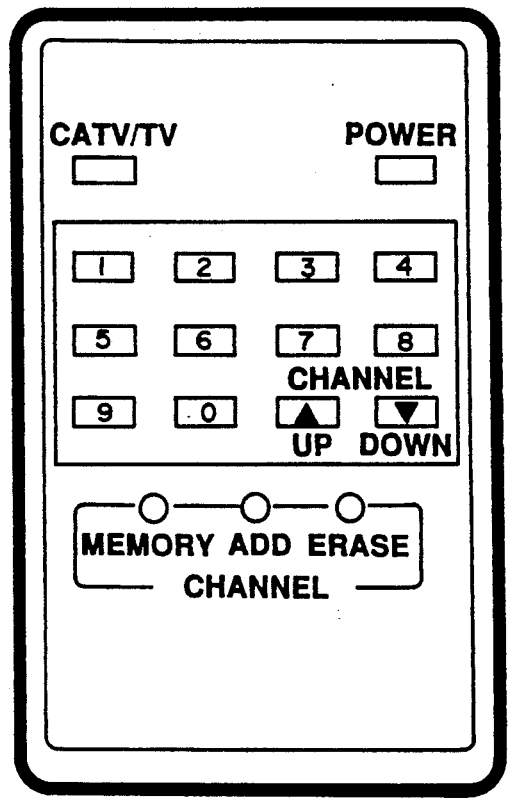
FIG. 4 is an explanatory view for explaining a key array of a key operating part used in the apparatus in FIG. 1.

FIG. 4 shows an example of a key operating part (remote controlled hand unit) to be used to feed a CH-up input, CH-down input and CATV/TV switching input to the MPU 6. This key operating part is provided with not only a power source key (POWER) switching on/off the power source of the receiver, CATV/TV key switching the CATV/TV, up-channel selecting key (CHANNEL UP) for the CH-up channel selection and down-channel selecting key (CHANNEL DOWN) for the CH-down channel selection but also ten keys 0 to 9 to be used for the direct channel selection or the like by inputting the channel number into the key and further presetting keys (MEMORY, ADD, ERASE) for memorizing in the skip flag memory 65 the information as to whether skipped or not at the time of up/down-selecting the respective channels of the CATV (or TV). Among them, the MEMORY key is an automatically preset auto-key so that, when it is pushed, the respective channels of the CATV (or TV) will be automatically sequentially switched, or so-called searched, the information of selecting the channel in which the signal is present will be memorized (that is to say, the skip-off information will be memorized) and the information of skipping the channel having no signal will be memorized (that is to say, the skip-on information will be memorized). The ADD and ERASE keys are manual keys for the user to manually memorize in the skip flag memory 65 whether the respective channels of the CATV (or TV) are to be skipped or not. For example, at the time of up/down selecting the channel in receiving the CATV, in case it is desired to skip (that is, to be on) only CATV 94CH, when 9 and 4 are pushed with the ten keys and then the ERASE key is pushed, the information to be skipped (on-information) will be able to be memorized in the skip flag memory 65. On the other CH, when the respective channel numbers are pushed with the ten keys and then the ADD key is pushed, the information not to be skipped (that is, off-information) will be able to be memorized in the skip flag memory 65. In the position number 94, CATV 94CH and UHF 43CH have a skip flag in common and therefore, in case the skip flag in on as described above and then CATV 94CH is switched to the TV reception, the skip flag will be on even on UHF 43CH. Also at the time of the TV reception, by the same operation, the information as to whether the respective channels of the VHF and UHF are to be automatically or manually skipped or not will be able to be memorized.

Figure 5:
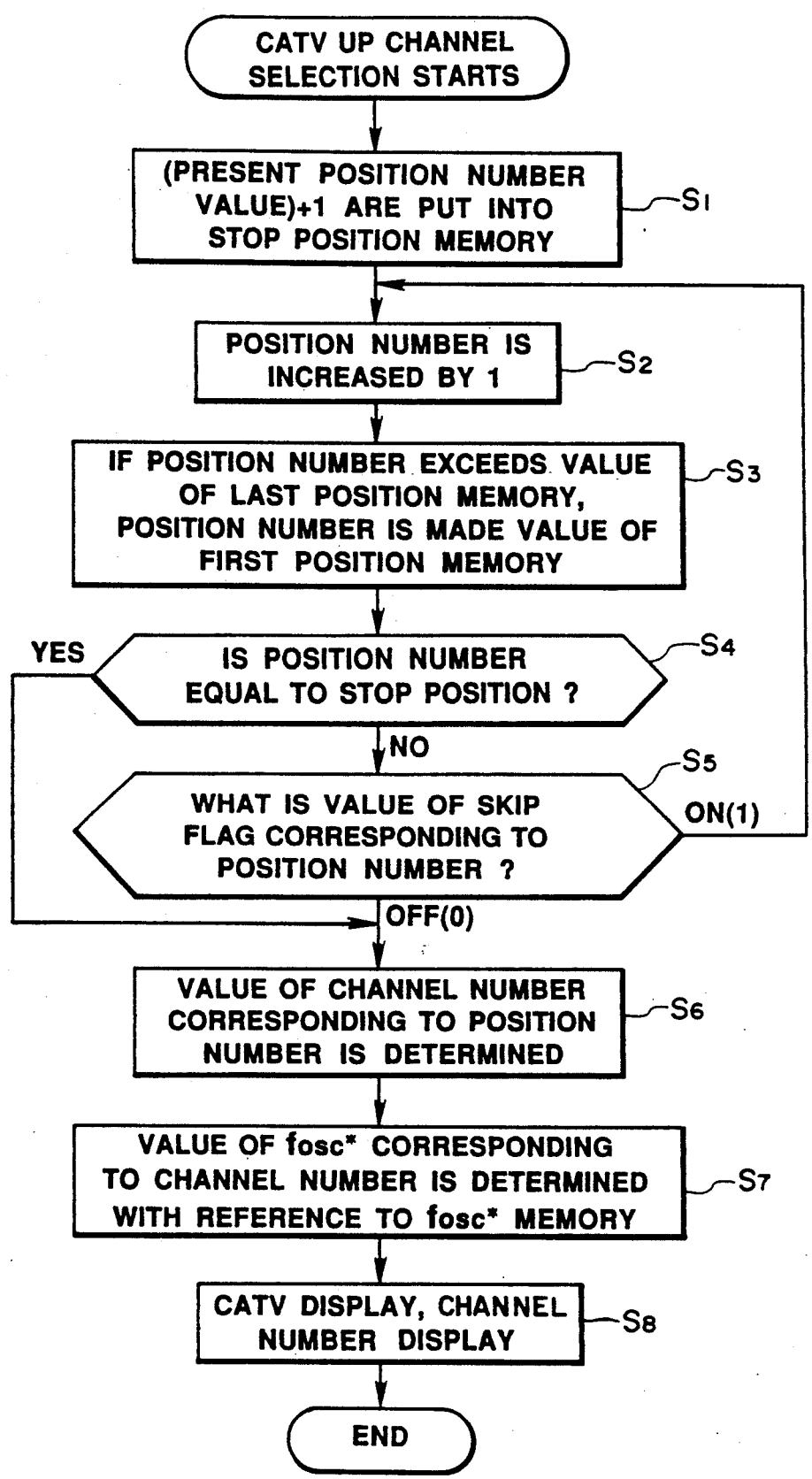
FIG. 5 is a flow chart showing the operation of the MPU when a CATV up-channel selection is made in FIG. 1.

FIG. 5 is a flow chart showing the operation of the MPU when channels are up-selected in the CATV. In the CATV receiving state, when the up-channel selecting key is pushed, as shown in the steps S2 and S3, the position number will be increased by 1 whenever the key is pushed. At this time, in case the number increases by one from the last position, an operation of making the position number the first position will be made. In FIG. 2, when there is a channel-up input, this operation will be made in the operation circuit 61 by referring to the first position memory 62 and last position memory 63. As described above, the step S4 is a step wherein, when the skip flag 1 stands in all the positions, it will be judged whether the skip flag will be pulled out of the reference loop or not. As shown in the step S5, in the process in which the position number is up, the value of the skip flag corresponding to the value of the position number memory 67 is judged. If the skip flag is on (that is, 1), the program will return to the step S2 and the position number will be automatically skipped to the next number. In the step S5, if the skip flag is off (that is, 0), as shown in the steps S6, S7 and S8, the value of the data fOSC* corresponding to the local oscillation frequency corresponding to the position number then will be determined and output and the respective data of the CATV display and channel number display will be output. The operations of the steps S5, S6 and S7 are as explained in FIG. 2.

The above mentioned embodiment has been explained on the channel selecting apparatus of the PLL frequency synthesizer system but the present invention can be applied to a channel selecting apparatus of a voltage synthesizer system.

As described above, according to the present invention, in the case of skipping the channel not required at the time of the up/down channel selection, a skip flag will be used in common and therefore the number of skip flags can be small. Therefore, the memory (RAM) capacity of the channel selecting microcomputer can be effectively utilized.

Figure 6:
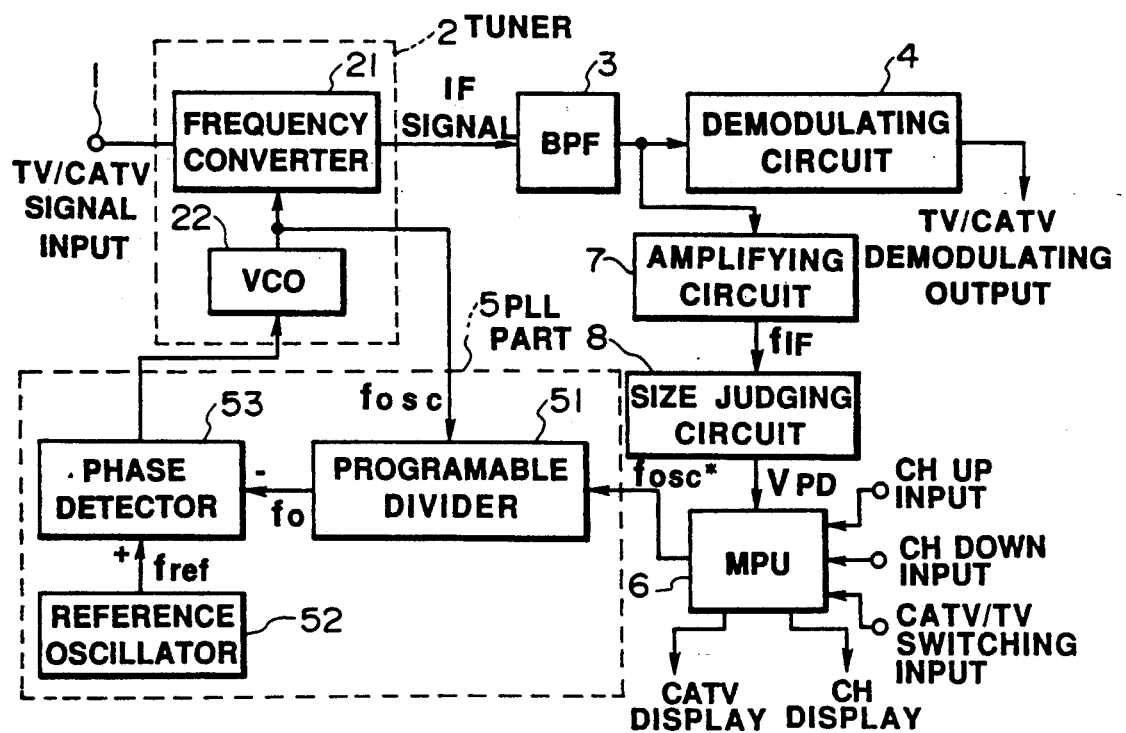
FIG. 6 is a block diagram showing a formation in which a means for quickly making a searching operation at the time of a channel selection is added to the apparatus in FIG. 1.

Now, in such apparatus as is shown in FIG. 1, in the case of receiving signals (for example, of the above described 125CH of the CATV and 69CH of the UHF) slightly different in the frequency in the same position, the circuit shown in FIG. 6 will be used.

In FIG. 6, an IFAGC amplifying circuit 7 and size judging circuit 8 are provided between the BPF 3 and MPU 6 in FIG. 6. The size judging circuit is a so-called AFT circuit. The frequency dividing ratio of the programable divider 51 is set by the data fOSC* from the MPU 6 in which, when the channel to be selected is designated by the user, the frequency dividing ratio will be renewed sequentially at a predetermined period from a frequency dividing ratio so that the frequency (tuned frequency fTUNE) of the local oscillation signal may be sequentially switched within a fixed range (tuned frequency range) from a tuned frequency (which shall be mentioned as a search starting frequency hereinafter) and may be continuously searched.

Figure 7:
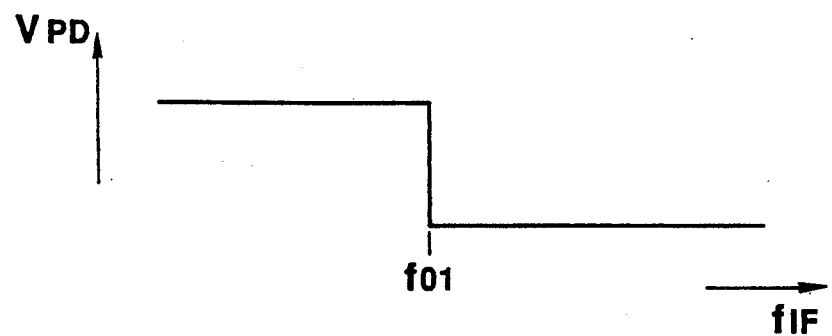
FIGS. 7 to 10 are explanatory views for explaining the operation in FIG. 6.

Here, the renewal of the frequency dividing ratio of the above mentioned programable divider 51 is controlled according to the size relation between the input signal frequency fIN and search starting tuning frequency fS. That is to say, the IF signal output from the BPF 3 is amplified and controlled to be of a fixed amplitude by the IFAGC amplifying circuit 7. This amplified controlled output is fed to the size judging circuit 8. The frequency fIF of the IF signal fed to this size judging circuit 8 will be different from the inherent intermediate frequency f01 if the input signal frequency fIN is different from the prescribed frequency. The size judging circuit 8 judges the sizes of this inherent intermediate frequency f01 and the actual intermediate frequency fIF at the time of starting the search to judge the size relation between the input signal frequency fIN and search starting tuned frequency fS. In this case, as shown in FIG. 7, if the actual intermediate frequency fIN at the time of starting the search, that is, the search starting tuned frequency fS, is larger than the input signal frequency fIN, the size judging circuit 8 will output a high level judging signal VPD. On the other hand, in the case reverse to this, a low level judging signal VPD will be output.

Figure 8:
Figure 9:
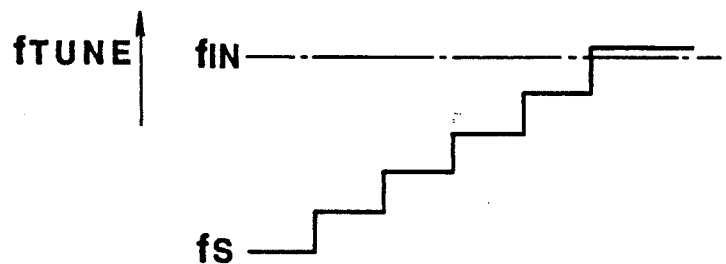

At the search starting time point, if the judging signal VPD is on a high level, the search starting tuned frequency fS will be larger than the input signal frequency fIN and therefore, as shown in FIG. 8, the above mentioned MPU 6 will renew the frequency dividing ratio of the programable divider 51 in the direction of lowering the tuned frequency fTUNE. On the contrary, if the judging signal VPD is on a low level, the search starting tuned frequency fS will be smaller than the input signal frequency fIN and therefore, as shown in FIG. 9, the frequency dividing ratio of the programable divider 51 will be renewed in the direction of elevating the tuned frequency fTUNE.

Figure 10:
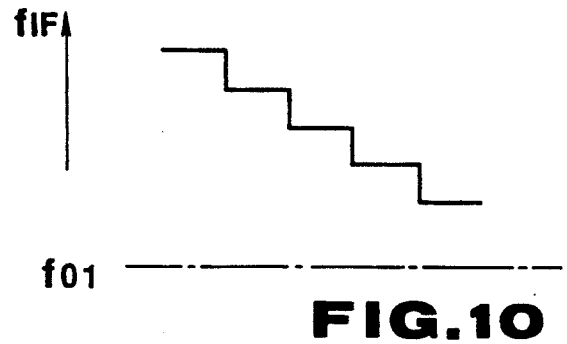

When the renewal of the tuned frequency fTUNE is thus controlled by a negative feedback in response to the size relation between the search starting tuned frequency fS and input signal frequency fIN, as shown in FIG. 10, the actual intermediate frequency fIF will be controlled to be always directed to the inherent intermediate frequency f01 from the search starting time and therefore the searching time of the respective channels may be short. FIG. 10 shows the case that the search starting tuned frequency fS is larger than the input signal frequency fIN.

The channel selecting apparatus provided with such AFT circuit as in this embodiment can be applied also to the case that the input signal frequency fIN is offset from the prescribed frequency, for example, as in the HRC (Harmonic Related Carriers) and IRC (Incremental Related Carriers) of the CATV in US.

Figure 11:
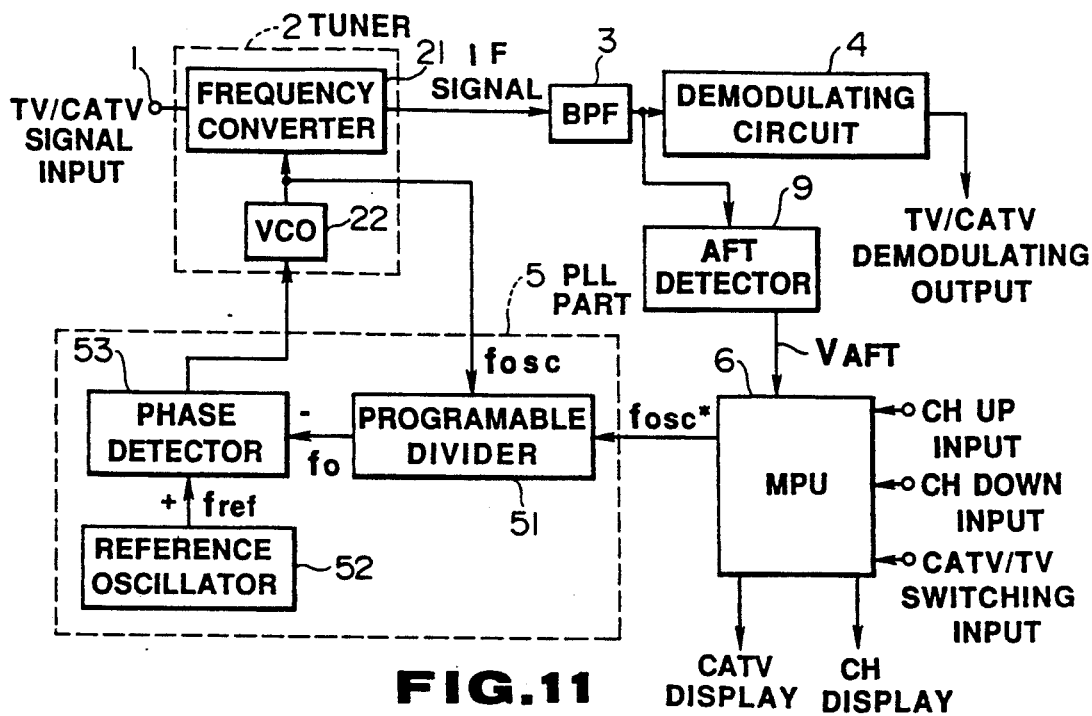
FIG. 11 is a block diagram showing a formation in which an AFT detecting means is added to the apparatus in FIG. 1.

Also, the apparatus shown in FIG. 11 is considered as another example of an apparatus wherein, in the apparatus shown in FIG. 1, in the case of selecting an object channel by the up/down channel selection, even if the input signal frequency of the channel is different from the normal frequency, it will be automatically searched and the skip information will be able to be memorized in the skip flag memory.

Figure 12:
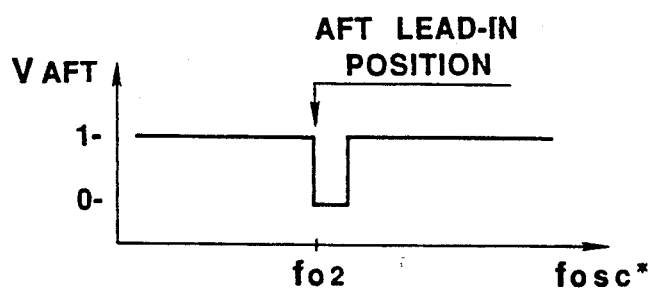
FIG. 12 is an explanatory view for explaining the operation of the AFT detector in FIG. 11.

In FIG. 11, an AFT detector 9 is provided between the BPF 3 and MPU 6 in FIG. 1. In the AFT detector 9, the frequency variation of the IF signal from the BPF 3 is taken out as a direct current voltage variation and whether the IF frequency is higher or lower than a predetermined value is transmitted to the MPU 6. That is to say, the AFT detector 9 outputs an AFT voltage VAFT and the MPU 6 controls fOSC* (local oscillation frequency expressing data delivered by the MPU) and searches a frequency f0₂ in which the VAFT will vary to be on a logical level "0" (0V) from a logical level "1" (5V) when fOSC* is elevated. The relation of VAFT with fOSC* is shown in FIG. 12.

Figure 13:
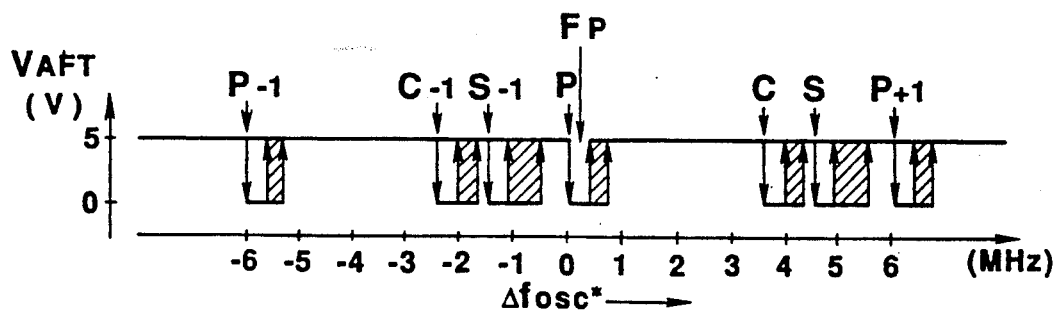
FIG. 13 is an explanatory view showing the characteristics of the AFT detector for an actual television signal input in FIG. 11.

Now, in the searching process in such AFT operation, the AFT will not be led into an objective video carrier P but will be led into a sound carrier S-1 of a lower adjacent channel or into a color sub-carrier C to make a mis-operation. FIG. 13 shows detection characteristics of an AFT detector 9 for an actual television signal. FIG. 13 shows variations of VAFT against the variations of fOSC*. P, C and S represent lead-in positions of the AFT respectively by the video carrier, color sub-carrier and sound carrier of the desired channel. S-1 and C-1 represent lead-in positions respectively by the sound carrier and color sub-carrier of the lower adjacent channel. P+1 represents a lead-in position by the video carrier of the upper adjacent channel. Here, if the value of fOSC* corresponding to the video carrier P is f0₂, $\Delta$ fOSC*=fOSC*−f0₂. In the drawing, the downward directed and upward directed arrows represent respectively the directions of the variation of VAFT when fOSC* is increased. Within the region (hatched) enclosed by the upward directed arrows on the right side of each carrier position, the VAFT varies upward. That is to say, it is shown that the rising position fluctuates substantially within this hatched range. The downward variation is in only the position in which each carrier is present. The AFT is led into this position.

Figure 14:
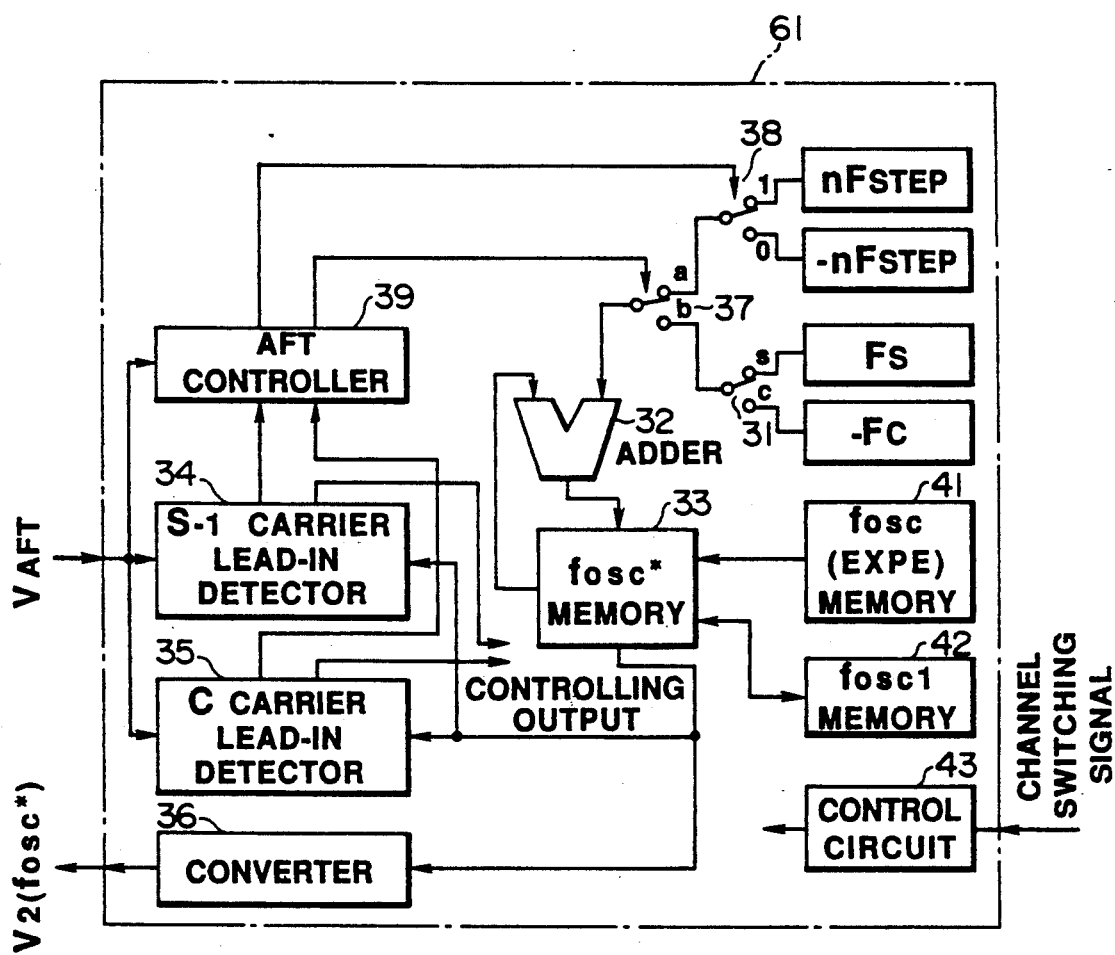
FIG. 14 is a block diagram showing an example of an operation circuit within the MPU in FIG. 11.

In order to avoid leading into the sound carrier S−1 of the lower adjacent channel or into the color sub-carrier C, the operation circuit 61 (See FIG. 2) within the MPU 6 is formed as shown in FIG. 14 so that the normal reception may be possible. In the process of searching the frequency f0₂ corresponding to the video carrier P, it is detected whether the AFT is led into the objective video carrier P, into the sound carrier S−1 of the lower adjacent channel or into the color sub-carrier C and, in case it is led into the carrier S−1 or carrier C, the video carrier P will be searched again.

In FIG. 14, Fs and −Fc represent means whereby, in order to search the carrier P again at the time of detecting respectively the carrier S−1 and carrier C, data of a fixed frequency to be increased or decreased from the value of fOSC* then are generated so that, at the time of detecting the carrier S−1 or carrier C, the FS or −FC may be switched by a switching circuit 31 and the fixed frequency FS or −FC may be fed to an adder 32 at one input end. The value fOSC1 of fOSC* set at the fOSC* memory 33 then is fed to the adder 32 at the other input end.

Here, for example, in the case of an M-NTSC system television signal, the value of FS may be made about 1.5 MHz+250 KHz=1.75 MHz. The above mentioned 1.5 MHz is a frequency difference between the video carrier P and the sound carrier S−1 of the lower adjacent channel and is defined to be 1.5 MHz={(Channel sole band width of 6.0 MHz)−(Sound intermediate frequency of 4.5 MHz)}. The above mentioned 250 KHz is a value taking into consideration the above described fluctuation of 125 KHz of the frequency difference between the channels and the fluctuation of the AFT circuit. The value of FC may be about 3.31 MHz in the M-NTSC system. Here, 3.31 MHz (Color sub-carrier frequency of 3.579545 MHz)−250 KHz.

On the basis of an input channel switching signal, a controlling circuit 43 loads an fOSC* memory 33 from an fOSC (EXPE) memory 41 with fixed frequency data corresponding to a desired channel. The frequency data fOSC* are converted to a voltage value V2 (fOSC*) by a converter 36 to switch the channel. An AFT detector 4 outputs an AFT voltage VAFT corresponding to V2 (fOSC*). An AFT controller 39 operates an AFT loop to search f02. When the AFT is led in, the AFT controller 39 will switch the switching circuit 37 to the b side so that an S−1 carrier lead-in detector 34 and carrier lead-in detector 35 may function. Whether the AFT is detected by the S−1 carrier lead-in detector 34 or by the C carrier lead-in detector 35 depends on whether the value of fOSC* then is on the sound carrier S−1 side of the lower adjacent channel of each channel or on the color sub-carrier C side of each channel.

The S−1 carrier lead-in detector 34 switches the switching circuit 31 to a data generating means FS with its controlling output, stores the value of the fOSC* memory 33 then once in an fOSC1 memory 42 and then increases the value of the fOSC* memory 33 by the predetermined frequency FS. Then, the AFT is measured and, when the VAFT is "0", the carrier P will have been detected and therefore the AFT will be judged to have been led into the carrier S−1 at fOSC*. In this case, if the carrier is searched again from the value of the fOSC* memory 33 then, that is, fOSC1+FS, the AFT will be able to be led into the P carrier. That is to say, the switching circuit 37 is switched to the a side to make a search with F STEP data. The operation of the switching circuit 38 switching the data memories nF STEP and −nF STEP is the same as in the switching circuit 25 of the prior art example (FIG. 10). If VAFT "0" is not detected in fOSC1+FS, fOSC1 will be judged to be a carrier P and the value of the fOSC1 memory 32 will be returned to the fOSC* memory 33.

The C carrier lead-in detector 35 switches the switching circuit 31 to the data generating means −FC with its controlling output, transfers the value of the fOSC* memory 33 then to fOSC1 and decreases the value of fOSC* by the predetermined frequency FC. Then the AFT is measured and, when the VAFT is "0", the carrier P will have been detected and therefore the AFT will be judged to have been led into the carrier C at the value fOSC1 of fOSC*. The same as in the case of S−1, if the switching circuit 37 is switched to the a side and the carrier P is searched by the F STEP unit from the carrier fOSC1-FC, the AFT will be able to be led into the carrier P. If VAFT "0" is not detected in fOSC1-FC, fOSC1 will be considered to have been the carrier P and fOSC* will be returned to fOSC1.

Figure 15:
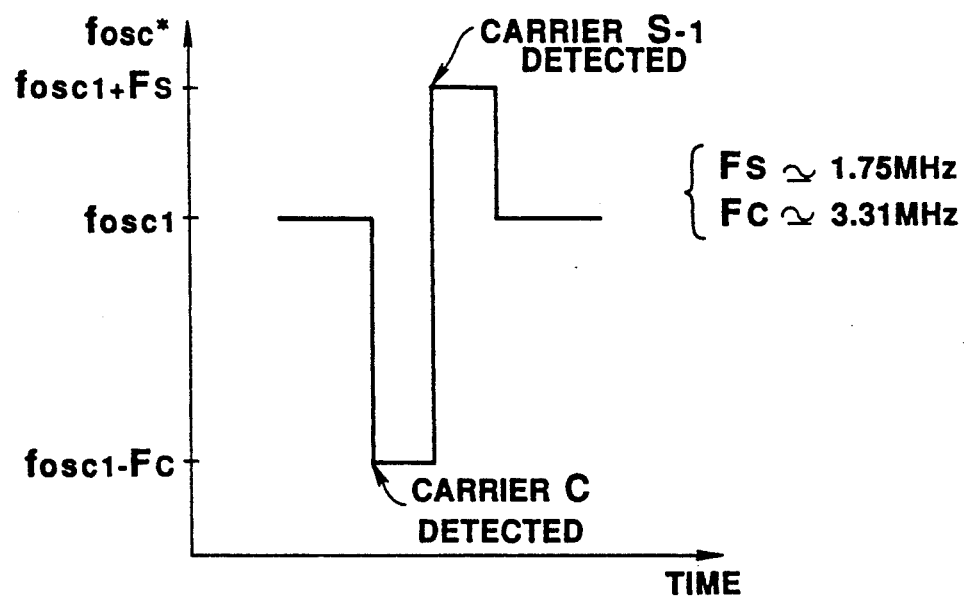
FIGS. 15 and 16 are explanatory views for explaining the operation in FIG. 14.

FIG. 15 illustrates an example of the operation of the circuit in FIG. 14. Time is taken on the abscissa and fOSC* is taken on the ordinate. At first, the value of fOSC* is made fOSC1-FC to detect a carrier C. Then, the value of fOSC* is made fOSC1+FS to detect a carrier S−1. In this case, as the AFT is not led into the carriers C and S−1, the value of fOSC* is returned to fOSC1.

Figure 16:
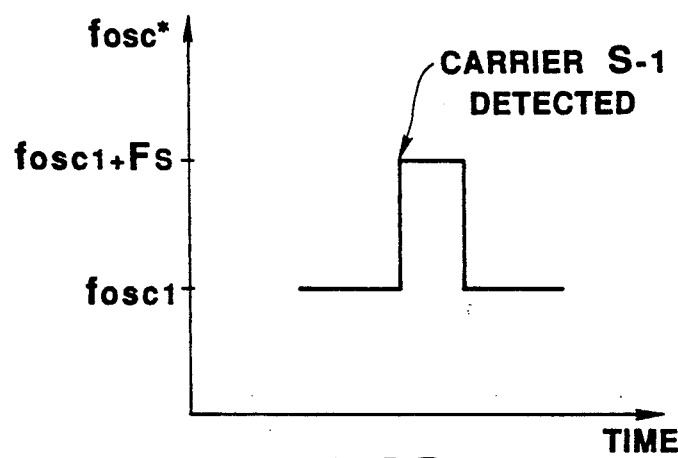

FIG. 16 illustrates another example of the operation of the circuit in FIG. 14 and shows the case of only detecting the carrier S−1. The value of fOSC* is made fOSC1+FS to detect the carrier S−1. As the AFT has been correctly led into the carrier P by fOSC1, the value of fOSC* is returned to fOSC1.

Now, it shall be explained with reference to FIG. 13 that the above mentioned means is effective.

(1) In case fOSC1 is led into P (that is, when fOSC1 is a frequency f02 corresponding to the carrier P), the carrier C will be detected with Δ fOSC*=−FC≃−3.31 MHz, therefore VAFT =5V (that is, logical "1") and no lead-in will be detected. As the carrier S−1 is detected with Δ fOSC*=−FC≃1.75 MHz, also, at this time, VAFT=5V and no lead-in will be detected. Therefore, the MPU will return fOSC* to fOSC1 (that is, f02) and it will be normally tuned with the carrier P.

(2) In case it is led into the carrier S−1, the carrier C will be detected with Δ fOSC*=−1.5 MHz−3.31 MHz=−4.81 MHz. Though this frequency is not illustrated, the characteristics in FIG. 13 will be periodically repeated at intervals of 6 MHz between channels. Therefore, for example, where Δ fOSC*=6 MHz−4.81 MHz=1.19 MHz, VAFT is 5V and no lead-in is detected. In the carrier S−1 detection, with Δ fOSC*=−1.5 MHz+1.75 MHz 0.25 MHz, VAFT 0V and it is judged to have been led into the carrier S−1. Therefore, as the search is resumed from 0.25 MHZ, it can be correctly led into the carrier P.

(3) In case it is led into the carrier C, if the carrier C is detected, Δ fOSC≃3.58 MHz−3.31 MHz=0.27 MHz, therefore VAFT=0V and it will be judged to have been led into the carrier C. As the search is resumed from 0.27 MHz, it can be correctly tuned with the carrier P. In this case, if the carrier S−1 is detected first, Δ fOSC*=3.58 MHz+1.75 MHz=5.33 MHz and VAFT will not be determined to be 0V or 5V. Therefore, this is not desirable.

As described above, according to the formation in FIG. 11, as means of discriminating the video carrier P and the sound carrier S−1 of the lower adjacent channel and discriminating the video carrier P and the color sub-carrier C, the frequency differences between S−1 and P and between P and C are utilized and therefore the video carrier P can be discriminated without resorting to a CATV transmitting system (that is, without resorting to the absolute frequency of the video carrier P).

As described above, according to the formation in FIG. 11 and the operation circuit formation in FIG. 14, an automatic channel selection by detecting signals is made possible without causing a mis-operation of selecting channels by leading the AFT into the sound carrier of the lower adjacent channel or the color sub-carrier of the desired channel.

Figure 17:
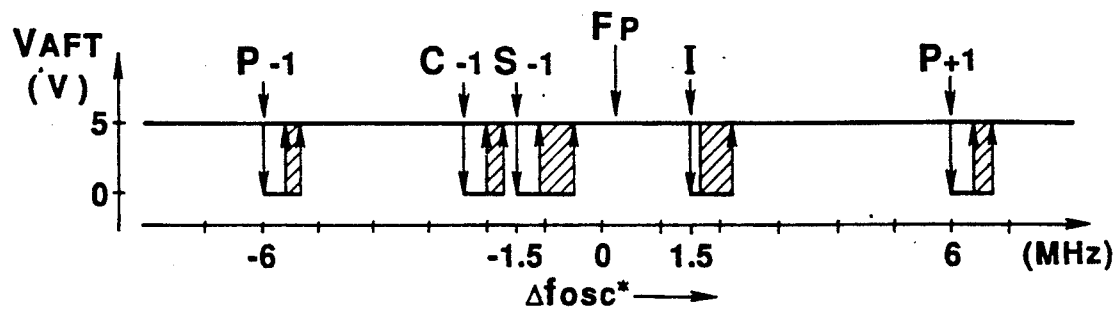
FIG. 17 is an explanatory view showing the characteristics of the AFT detector in FIG. 11 in the case that there is no broadcast signal in the desired channel.

Now, in the frequency searching process by the AFT operation in the apparatus in FIG. 11, in case there is a broadcast signal (that is, there is a video carrier P) in the desired channel, the detecting characteristics of the AFT detector 9 will be as shown in FIG. 13 but, in case there is no broadcast signal in the desired channel, the characteristics of the AFT detector will be as shown in FIG. 17. It is shown that, in this case, when Δ fOSC* is 1.5 MHz, the AFT will be led into spurious I. In case there is no boradcast signal in the desired channel but there are signals in the upper and lower adjacent channels, when the video carrier P+1 of the upper adjacent channel, the video carrier P−1 of the lower adjacent channel and the sound carrier S−1 of the lower adjacent channel modulate with one another in the frequency converter, this spurious I will be generated.

Also, in FIG. 13, no spurious I appears, because, as there is a signal in the desired channel, the RF amplifier in the front step of the frequency converter is not in the maximum sensitivity state by the AGC operation.

Figure 18:
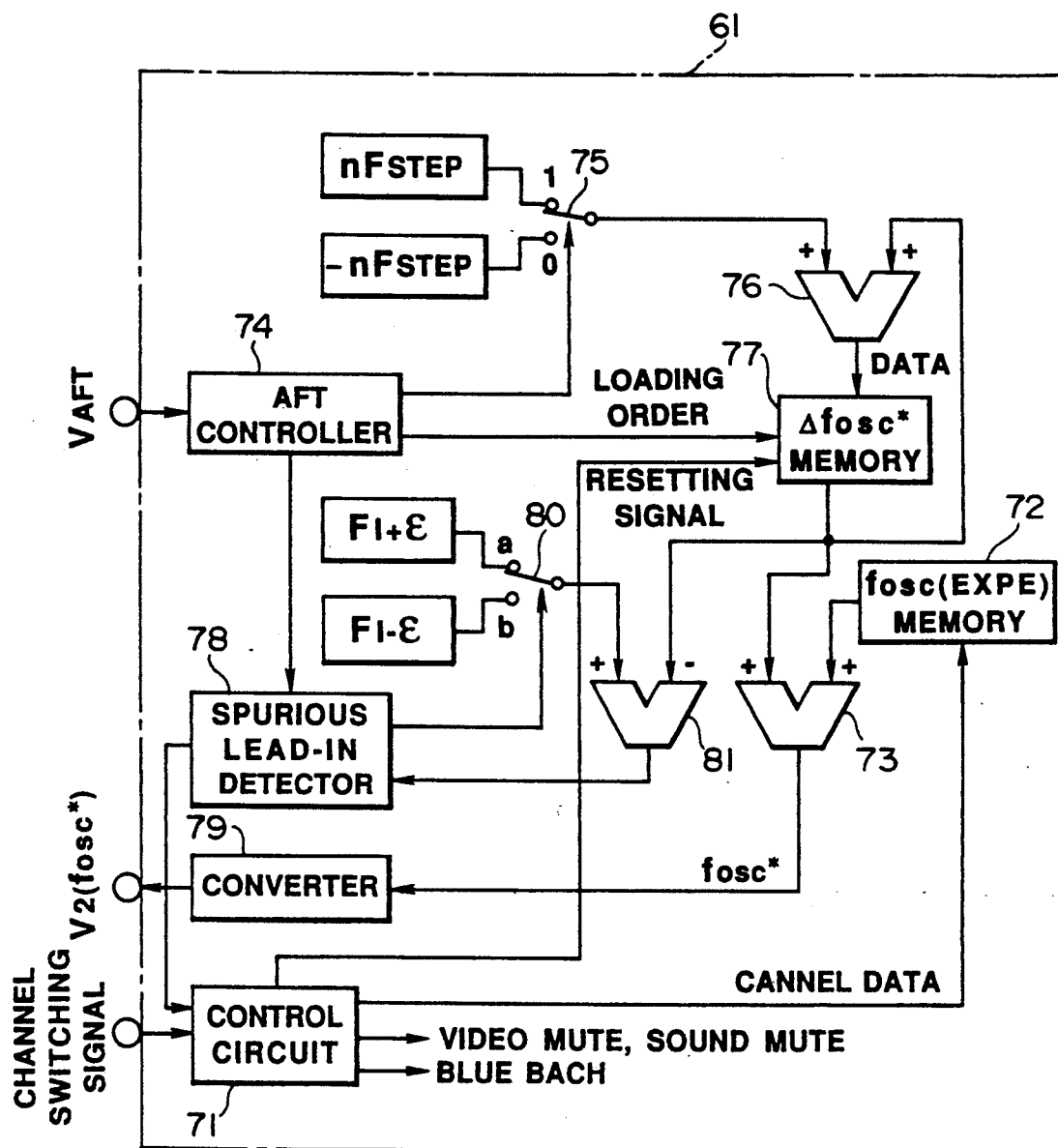
FIGS. 18 and 19 are block diagrams showing other examples of the operation circuit within the MPU in FIG. 11.

Thus, in case there is no broadcast signal in the desired channel, when the AFT is led into the spurious I, a mixed signal picture will be displayed. Therefore, in order to avoid it, when the operation circuit 61 (See FIG. 2) within the MPU 6 is formed as shown in FIG. 18, a normal signal reception will be possible. That is to say, in the process of searching the frequency f02 corresponding to the video carrier P, when $\Delta$ fOSC* is 1.5 MHz, if the AFT is led into the spurious I (that is to say, if the AFT voltage VAFT becomes "0") or, when $\Delta$ fOSC* is near 0.2 MHz, if the AFT is not led in (that is to say, if the AFT voltage VAFT is not "0"), no broadcast signal will be judged to be in the desired channel. When this non-signal judgment is used, at the time of the up/down channel selection, that channel will not be selected but the next channel will be able to be selected and, at the time of a direct channel selection, the picture will be made blue (or will not be colored) and the sound will be able to be muted.

In FIG. 18, on the basis of the input channel switching signal, a controlling circuit 71 feeds fixed frequency data fOSC (EXPE) corresponding to a desired channel to an adder 73 at one input end from an fOSC (EXPE) memory 72. An AFT voltage (divalent output) VAFT from an AFT detector 9 is input into an AFT controller 74 and is used to switch a switching circuit 75. The AFT controller 74 will switch the switching circuit 75 to the data memory nF STEP side in order to increase the frequency at a fixed step F STEP when the VAFT is "1" but will switch the switching circuit 75 to the data memory −nF STEP side in order to decrease the frequency at a fixed step F STEP when the VAFT is "0". The output from the switching circuit 75 is fed to an adder 76 at one input end. The value of $\Delta$ fOSC* set in a $\Delta$ fOSC* memory 77 then is fed to the adder 76 at the other input end. The AFT controller 74 detects from the variation of the VAFT that the value of the $\Delta$ fOSC* memory 77 has become the frequency of the downward directed arrow in FIGS. 13 and 17 (that is, detects that the AFT has been led in) and transmits it to a spurious lead-in detector 78 and to the $\Delta$ fOSC* memory 77. When the AFT is led in, the $\Delta$ fOSC* memory 77 will be loaded with the data of an adder 76. Its frequency data $\Delta$ fOSC* are fed to the above mentioned adder 73 at the other input end and are added to the frequency data fOSC (EXPE) in the adder 73 and the added output (digital data) is converted to an analogue voltage value V2 (fOSC*) by a converter 79 and is output.

On the other hand, FI+ϵ and FI−ϵ are means of generating fixed frequency data FI+ϵ and FI−ϵ for judging whether the frequency led in by AFT is a spurious frequency FI or not so that, when the AFT leads in the frequency, FI+ϵ or FI−ϵ will be switched and the fixed frequency FI+ϵ or FI−ϵ will be fed to a subtracter 81 at one input end (+). Here, FI=1.5 MHz and ϵ=0.1875 MHz. The value of $\Delta$ fOSC* set at the $\Delta$ fOSC* memory 77 then is fed to the subtracter 81 at the other input end (−). The above mentioned spurious lead-in detector 78 controls the switching circuit 80 to be switched to the a side or b side when the AFT is led in and judges the output of the subtracter 81 to be positive or negative so that, in case the switching circuit 80 is positive when on the a side and is negative when on the b side, the AFT will be considered to be led into the spurious I and this will be transmitted to the controlling circuit 71. When the AFT is led into the spurious I, the controlling circuit 71 will reset the $\Delta$ fOSC* memory 77 to make the fOSC* output fOSC (EXPE). At this time, the controlling circuit 71 will judge this channel to be of no signal so that, at the time of an up/down channel selection, that channel will not be selected but the next channel will be selected or, at the time of a direct channel selection, the picture will be made, for example, blue (called a blue back) and the sound will be muted.

Figure 19:
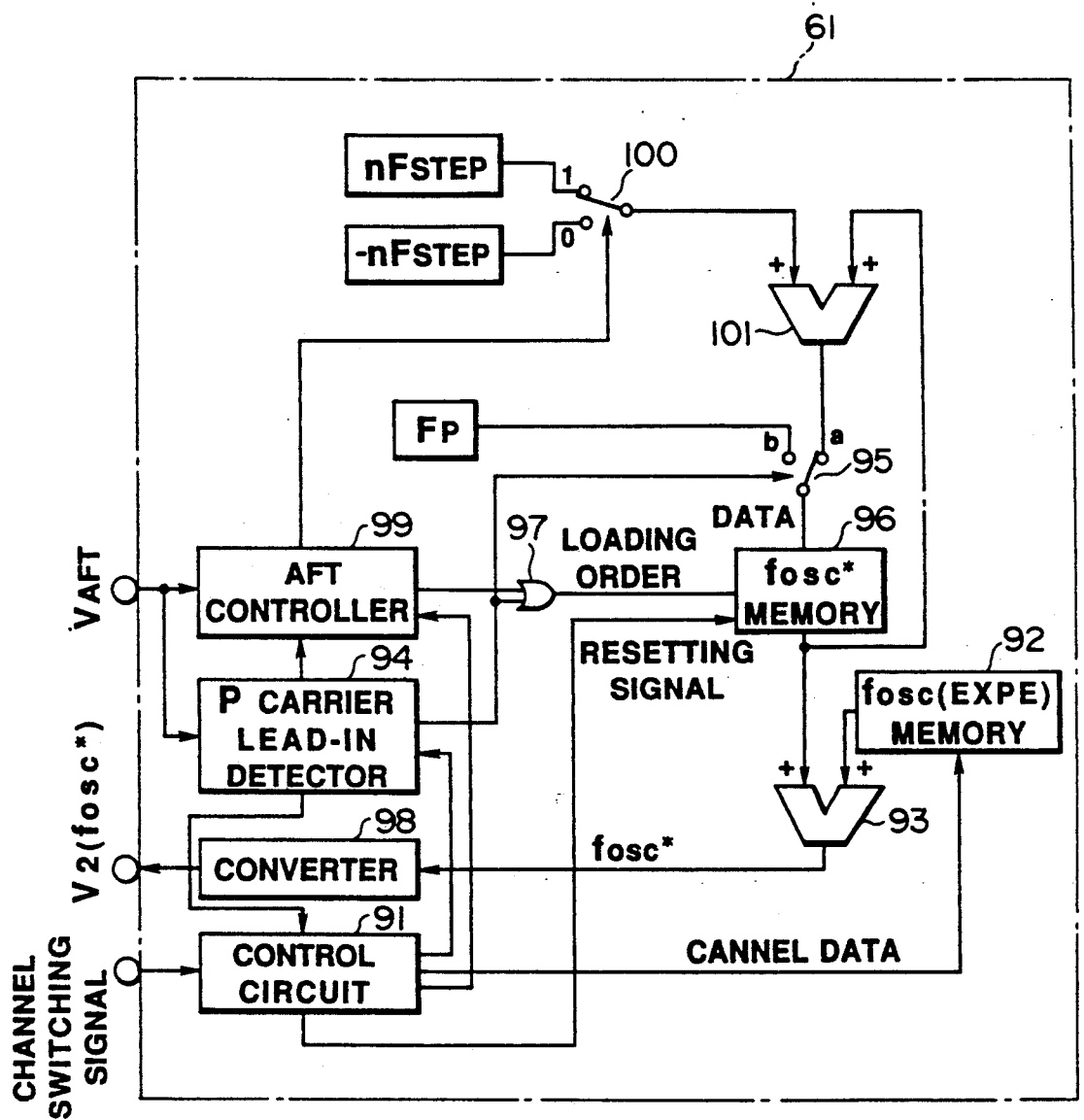

In FIG. 18, by detecting that the AFT is led into the spurious I, the desired channel is judged to have no signal but, in FIG. 19, by detecting that it is not led into the vicinity of the video carrier P, the desired channel is judged to have no signal.

In FIG. 19, on the basis of an input channel switching signal, the controlling circuit 91 delivers frequency data fOSC (EXPE) corresponding to the desired channel to an adder 93 at one input end from an fOSC (EXPE) memory 92. An AFT voltage (divalent output) VAFT from an AFT detector 9 is input into a P carrier lead-in detector 94 and is used to switch a switching circuit 95. When the AFT is led in, the P carrier lead-in detector 94 will switch the switching circuit 95 so as to feed data FP from a data memory FP to a $\Delta$ fOSC* memory 96. The data FP are about +0.2 MHz (See FIGS. 13 and 17). When the AFT is led in, the $\Delta$ fOSC* memory 96 will receive a loading order through an OR-gate 97 from the P carrier lead-in detector 94 and will be loaded with the data FP. The output of the $\Delta$ fOSC* memory 96 is fed to the above mentioned adder 93 at the other input end and the value combined with the frequency data fOSC (EXPE) by the adder 93 is made the value of fOSC*. That is to say, fOSC*=fOSC (EXPE)+$\Delta$ fOSC*

$\Delta$ fOSC*=FP≈0.2 MHz.

In the P carrier lead-in detector 94, after the above mentioned fOSC* is delivered through a converter 98, after a predetermined time, the AFT voltage VAFT is measured and, when it is 0V, that is, "0" in FP as in FIG. 13, a video carrier P will be recognized to be present and the control will be transferred to an AFT controller 99. At this time, the switch circuit 95 is switched to the a side. By the way, the converter 98 is to convert digital data fOSC* to an analogue voltage value V2 (fOSC*).

When VAFT measured by the P carrier lead-in detector 94 is 5V, that is, "1", The video carrier P of the desired channel will be judged to be absent and this will be transmitted to the controlling circuit 91. In the controlling circuit 91, the $\Delta$ fOSC* memory 96 is reset and the fOSC* output is made fOSC (EXPE). Also, at this time, the controlling circuit 71 will operate the same as in the case of FIG. 18 and, at the time of an up/down channel selection, that channel will not be selected but the next channel will be selected or, at the time of a direct channel selection, the picture will be made, for example, blue (called a blue back) and the sound will be muted.

After the control is transferred to the AFT controller 99, the AFT detector 9 will output an AFT voltage VAFT corresponding to V2 (fOSC*) and the AFT controller 99 will operate an AFT loop to search f02. That is to say, the AFT voltage (divalent output) from the AFT detector 9 will be input into the AFT controller 99 and will be used to switch a switching circuit 100. By the AFT controller 99, the switch circuit 100 is switched to the data memory nF STEP side in order to increase the frequency at a fixed step F STEP when the VAFT is "1" but to the data memory −nF STEP side in order to decrease the frequency at a fixed step F STEP when the VAFT is "0". The output from the switch circuit 100 is fed to an adder 101 a one input end. The value of Δ fOSC* set then at the Δ fOSC* memory 96 is fed to the adder 101 at the other input end. The output of the adder 93 is output as V2 (fOSC*) through the converter 98. The AFT detector 9 outputs an AFT voltage VAFT corresponding to V2 (fOSC*).

As described above, according to the formation in FIG. 11 and the formation of the operation circuit in FIGS. 18 or 19, in case there is no broadcast signal in a desired channel but there are broadcast signals in the upper and lower adjacent channels, the mis-operation of selecting channels by the obstruction by mixed signals (generated particularly in a strong electric field region) can be prevented. Therefore, the present invention is useful for automatically selecting channels by detecting present signals and for making a black picture when there is no signal.

What is claimed is:

1. A channel selecting apparatus comprising:
   tuner means for mixing an input high frequency signal with a local oscillation signal controlled by a tuning voltage to provide an intermediate frequency signal representing a desired channel; and
   controlling means for performing, in accordance with a channel-up or channel-down channel selecting operation, the functions of:
      outputting data corresponding to local oscillation frequencies of the respective desired channels,
      preparing the tuning voltage in accordance with the data,
      controlling the local oscillation signal mixed by the tuner means,
      storing common channel selection inhibiting information indicating whether the controlling means is inhibited or permitted to control the tuner means to select the respective desired channels at the time of a channel-up or channel-down channel selection, the common channel selection inhibiting information identifying a plurality of channels not allowed to exist simultaneously, and
      controlling the tuner means to select the desired channels in accordance with the common channel selection inhibiting information,
   said controlling means comprising:
      operation processing means for, in accordance with the channel-up or channel-down channel selecting operation, generating the data corresponding to local oscillation frequencies of the respective channels;
      means for storing the common channel selection inhibiting information indicating whether the controlling means is inhibited or permitted to control the tuner to select the respective desired channels at the time of the channel-up or channel-down channel selection, the common channel selection inhibiting information identifying the plurality of channels not allowed to exist simultaneously; and
      PLL means for preparing the tuning voltage in accordance with the data corresponding to the local oscillation frequencies provided by the operation processing means and controlling the local oscillation frequency of said tuner to coincide with the data corresponding to the local oscillation frequencies,
   said operation processing means comprising:
      a first position memory for storing first channel data corresponding to a channel corresponding to a first position;
      a last position memory for storing last channel data corresponding to a channel corresponding to a last position;
      a channel number memory for storing channel number data corresponding to a position number;
      a skip flag memory for storing information indicating whether each channel is to be skipped at the up/down channel selecting time;
      a position number memory for storing position data corresponding to a position number;
      a stop position memory for storing stop position data corresponding to a position up by 1 channel from the present position of the up/down channel selection starting time and used to stop a loop continuing to refer to skip flags when the skip flags stand in all positions;
      a local oscillation frequency data memory for storing data corresponding to local oscillation frequencies relating to channel numbers; and
      an operation circuit for performing, when a channel-up or channel-down key input is received, in accordance with the information stored in the skip flag memory, the functions of:
         selecting a channel,
         storing data identifying a position of the selected channel in the position number memory,
         reading data corresponding to the position or the selected channel from the channel number memory;
         preparing selected channel data corresponding to local oscillation frequencies relating to a channel number of the selected channel in accordance with the data corresponding to the local oscillation frequencies; and
         outputting the selected channel data to the PLL means.

2. A channel selecting apparatus comprising:
   tuner means for mixing an input high frequency signal with a local oscillation signal controlled by a tuning voltage to provide an intermediate frequency signal representing a desired channel;
   size judging means for determining the magnitude of a frequency of the input high frequency signal at a channel selecting time and a tuned frequency which corresponds to a frequency of the local oscillation signal at a search starting time;
   controlling means for performing, in accordance with a channel-up or channel-down channel selecting operation, the functions of:
      outputting data corresponding to local oscillation frequencies of the respective desired channels,
      preparing a tuning voltage in accordance with the data, controlling the local oscillation signal mixed by the tuner means, storing common channel selection inhibiting information indicating whether the controlling means is inhibited or permitted to control the tuner means to select the respective desired channels at the time of a channel-up or channel-down channel selection, the common channel selection inhibiting information identifying a plurality of channels not allowed to exist simultaneously, and controlling, by a negative feedback, the tuner means to lower the tuned frequency when the size judging means determines that the tuned frequency at the search starting time is larger than the input high frequency signal frequency and to increase the tuned frequency when the size judging means determines that the tuned frequency at the search starting time is smaller than the input high frequency signal frequency.

3. A channel selecting apparatus according to claim 2, wherein said controlling means comprises:

operation processing means for, in accordance with the channel-up or channel-down channel selecting operation, generating the data corresponding to local oscillation frequencies of the respective channels;

means for storing the common channel selection inhibiting information indicating whether the controlling means is inhibited or permitted to control the tuner means to select the respective desired channels at the time of the channel-up or channel-down channel selection, the common channel selection inhibiting information which identifies the plurality of channels not allowed to exist simultaneously;

means for controlling, by a negative feedback, the tuner means to lower the tuned frequency when the size judging means determines that the tuned frequency at the search starting time is larger than the input high frequency signal frequency and to increase the tuned frequency when the size judging means determines that the tuned frequency at the search starting time is smaller than the input high frequency signal frequency; and PLL means for preparing the tuning voltage in accordance with the data corresponding to the local oscillation frequencies provided by the operation processing means and controlling the local oscillation frequency of said tuner means to coincide with the data corresponding to the local oscillation frequencies.

4. A channel selecting apparatus comprising:

tuner means for mixing an input high frequency signal with a local oscillation signal controlled by a tuning voltage to provide an intermediate frequency signal representing a desired channel;

AFT detecting means for detecting a difference between a prescribed frequency and a frequency of the intermediate frequency signal when a frequency of the local oscillation signal is one of increased or decreased, the AFT detecting means outputting the difference as an AFT voltage;

controlling means for performing, in accordance with a channel-up or channel-down channel selecting operation, the functions of:

outputting data corresponding to local oscillation frequencies of the desired respective channels, said data corresponding to the local oscillation frequencies being output in accordance with the AFT voltage from the AFT detecting means, preparing a tuning voltage in accordance with the data corresponding to the local oscillation frequencies, controlling the local oscillation signal of the tuner means, storing common channel selection inhibiting information indicating whether the controlling means is inhibited or permitted to select the respective desired channels at the time of a channel-up or channel-down channel selection, the common channel selection inhibiting information identifying a plurality of channels not allowed to exist simultaneously, and searching a frequency of a video carrier to determine a difference between the frequency of the video carrier and a frequency of a sound carrier of a lower adjacent channel and a difference between the video carrier frequency and a frequency of a color sub-carrier of a lower adjacent channel to determine whether the AFT voltage coincides with one of the sound carrier and the color sub-carrier and to determine whether the AFT voltage coincides with the video carrier, when the AFT coincides with one of the sound carrier and color sub-carrier, the video carrier is searched again until the AFT voltage is determined to coincide with the video carrier thereby identifying a frequency of the desired channel.

5. A channel selecting apparatus according to claim 1, wherein said controlling means comprises:

operation processing means for, in accordance with the channel-up or channel-down channel selecting operation, outputting the data corresponding to local oscillation frequencies of the desired respective channels;

means for storing the common channel selection inhibiting information indicating whether the controlling means is inhibited or permitted to select the respective desired channels at the time of a channel-up or channel-down channel selection, the common channel selection inhibiting information which identifies a plurality of channels not allowed to exist simultaneously;

means for searching a frequency of a video carrier to determine a difference between the frequency of the video carrier and a frequency of a sound carrier of a lower adjacent channel and a difference between the video carrier frequency and a frequency of a color sub-carrier of a lower adjacent channel to determine whether the AFT voltage coincides with one of the sound carrier and the color sub-carrier and to determine whether the AFT voltage coincides with the video carrier, when the AFT coincides with one of the sound carrier and color sub-carrier, the video carrier is searched again until the AFT voltage is determined to coincide with the video carrier thereby identifying a frequency of the desired channel; and PLL means for preparing the tuning voltage in accordance with the data corresponding to the local oscillation frequencies provided by the operation processing means and controlling the local oscillation frequency of said tuner means to coincide with the data corresponding to the local oscillation frequencies.

6. A channel selecting apparatus comprising:

tuner means for mixing an input high frequency signal with a local oscillation signal controlled by a tuning voltage to provide an intermediate frequency signal representing a desired channel;

AFT detecting means for detecting a difference between a prescribed frequency and a frequency of the intermediate frequency signal when a frequency of the local oscillation signal is one of increased or decreased, the AFT detecting means outputting the difference as an AFT voltage; and controlling means for performing, in accordance with a channel-up or channel-down channel selecting operation, the functions of:

automatically distinguishing cable television channels from UHF television channels;

outputting data corresponding to local oscillation frequencies of the desired respective channels, said data corresponding to the local oscillation frequencies being output in accordance with the AFT voltage from the AFT detecting means, preparing a tuning voltage in accordance with the data corresponding to the local oscillation frequencies, controlling the local oscillation signal of the tuner means, storing common channel selection inhibiting information indicating whether the controlling means is inhibited or permitted to select the respective desired channels at the time of a channel-up or channel-down channel selection, the common channel selection inhibiting information identifying a plurality of channels not allowed to exist simultaneously, determining a difference between the data corresponding to the local oscillation frequencies and data corresponding to a video carrier of a desired channel to determine whether the AFT voltage coincides with a specific frequency and to detect that no signal exists at the desired channel frequency and providing a non-signal detection signal indicative thereof, and controlling the tuner means to select the desired channel in accordance with the non-signal detection signal and the common channel selection inhibiting information.

7. A channel selecting apparatus according to claim 6, wherein said controlling means comprises:

operation processing means for, in accordance with the channel-up or channel-down channel selecting operation, outputting the data corresponding to local oscillation frequencies of the desired respective channels;

means for storing the common channel selection inhibiting information indicating whether the controlling means is inhibited or permitted to select the respective desired channels at the time of a channel-up or channel-down channel selection, the common channel selection inhibiting information which identifies a plurality of channels not allowed to exist simultaneously;

means for determining a difference between the data corresponding to the local oscillation frequencies and data corresponding to a video carrier of a desired channel to determine whether the AFT voltage coincides with a specific frequency and to detect that no signal exists at the desired channel frequency and providing a non-signal detection signal indicative thereof; and PLL means for preparing the tuning voltage in accordance with the data corresponding to the local oscillation frequencies provided by the operation processing means and controlling the local oscillation frequency of said turner means to coincide with the data corresponding to the local oscillation frequencies.

8. A channel selecting apparatus according to claim 7, wherein a spurious wave produced by said tuner means in accordance with mutual modulation between an upper adjacent channel and a lower adjacent channel is used as a specific frequency wave in said operation processing means.

9. A channel selecting apparatus according to claim 7, wherein the video carrier is used as a specific frequency wave in said operation processing means.

10. A channel selecting apparatus according to claim 1, 2, 4 or 6, wherein said tuner means comprises:

frequency converting means for converting the input high frequency signal to the intermediate frequency signal in accordance with the local oscillation frequency; and voltage controlling oscillator means for generating the local oscillation frequency in accordance with the tuning voltage and providing the local oscillation frequency to said frequency converting means.

11. A channel selecting apparatus according to claim 1, 3, 5 or 7, wherein said PLL means comprises:

a variable frequency divider for dividing the local oscillation frequency from said voltage controlling oscillator means with the data corresponding to the local oscillation frequencies from said operation processing means and outputting a divided frequency indicative thereof;

a reference oscillator for generating a reference oscillation frequency; and a phase comparator for comparing the reference oscillation frequency output from the reference oscillator with the divided frequency output from the variable frequency divider and outputting a comparison result indicative thereof, and for controlling the voltage controlling oscillator in accordance with said comparison result.

12. A channel selecting apparatus comprising:

tuner means for mixing an input high frequency signal with a local oscillation signal controlled by a tuning voltage to provide an intermediate frequency signal representing a desired channel, said tuner means comprising:

frequency converting means for converting the input high frequency signal to the intermediate frequency signal in accordance with the local oscillation frequency; and voltage controlling oscillator means for generating the local oscillation frequency in accordance with the tuning voltage and providing the local oscillation frequency to said frequency converting means;

AFT detecting means for detecting a difference between a prescribed frequency and a frequency of the intermediate frequency signal when a frequency of the local oscillation signal is one of increased or decreased, the AFT detecting means outputting the difference as an AFT voltage; and controlling means for performing, in accordance with a channel-up or channel-down channel selecting operation, the functions of:
  outputting data corresponding to local oscillation frequencies of the desired respective channels, said data corresponding to the local oscillation frequencies being output in accordance with the AFT voltage from the AFT detecting means,
  preparing a tuning voltage in accordance with the data corresponding to the local oscillation frequencies,
  controlling the local oscillation signal of the tuner means,
  storing common channel selection inhibiting information indicating whether the controlling means is inhibited or permitted to select the respective desired channels at the time of a channel-up or channel-down channel selection, the common channel selection inhibiting information identifying a plurality of channels not allowed to exist simultaneously,
  determining a difference between the data corresponding to the local oscillation frequencies and data corresponding to a video carrier of a desired channel to determine whether the AFT voltage coincides with a specific frequency and to detect that no signal exists at the desired channel frequency and providing a non-signal detection signal indicative thereof, and
  controlling the tuner means to select the desired channel in accordance with the non-signal detection signal and the common channel selection inhibiting information.

13. A channel selecting apparatus comprising:
  tuner means for mixing an input high frequency signal with a local oscillation signal controlled by a tuning voltage to provide an intermediate frequency signal representing a desired channel;
  AFT detecting means for detecting a difference between a prescribed frequency and a frequency of the intermediate frequency signal when a frequency of the local oscillation signal is one of increased or decreased, the AFT detecting means outputting the difference as an AFT voltage; and
  controlling means for performing, in accordance with a channel-up or channel-down channel selecting operation, the functions of:
    outputting data corresponding to local oscillation frequencies of the desired respective channels, said data corresponding to the local oscillation frequencies being output in accordance with the AFT voltage from the AFT detecting means,
    preparing a tuning voltage in accordance with the data corresponding to the local oscillation frequencies,
    controlling the local oscillation signal of the tuner means,
    storing common channel selection inhibiting information indicating whether the controlling means is inhibited or permitted to select the respective desired channels at the time of a channel-up or channel-down channel selection, the common channel selection inhibiting information identifying a plurality of channels not allowed to exist simultaneously,
    determining a difference between the data corresponding to the local oscillation frequencies and data corresponding to a video carrier of a desired channel to determine whether the AFT voltage coincides with a specific frequency and to detect that no signal exists at the desired channel frequency and providing a non-signal detection signal indicative thereof, and
    controlling the tuner means to select the desired channel in accordance with the non-signal detection signal and the common channel selection inhibiting information,
  said controlling means comprising:
    operation processing means for, in accordance with the channel-up or channel-down channel selecting operation, outputting the data corresponding to local oscillation frequencies of the desired respective channels;
    means for storing the common channel selection inhibiting information indicating whether the controlling means is inhibited or permitted to select the respective desired channels at the time of a channel-up or channel-down channel selection, the common channel selection inhibiting information which identifies a plurality of channels not allowed to exist simultaneously;
    means for determining a difference between the data corresponding to the local oscillation frequencies and data corresponding to a video carrier of a desired channel to determine whether the AFT voltage coincides with a specific frequency and to detect that no signal exists at the desired channel frequency and providing a non-signal detection signal indicative thereof; and
    PLL means for preparing the tuning voltage in accordance with the data corresponding to the local oscillation frequencies provided by the operation processing means and controlling the local oscillation frequency of said tuner to coincide with the data corresponding to the local oscillation frequencies.

14. A channel selecting apparatus according to claim 13, wherein a spurious wave produced by said tuner in accordance with mutual modulation between an upper adjacent channel and a lower adjacent channel is used as a specific frequency wave in said operation processing means.

15. A channel selecting apparatus according to claim 13, wherein the video carrier is used as a specific frequency wave in said operation processing means.

16. A channel selecting apparatus according to claim 13, wherein said PLL means comprises:
  a variable frequency divider for dividing the local oscillation frequency from said voltage controlling oscillator means with the data corresponding to the local oscillation frequencies from said operation processing means and outputting a divided frequency indicative thereof;
  a reference oscillator for generating a reference oscillation frequency; and
  a phase comparator for comparing the reference oscillation frequency output from the reference oscillator with the divided frequency output from the variable frequency divider and outputting a comparison result indicative thereof, and for controlling the voltage controlling oscillator in accordance with said comparison result.

* * * * *